US008539307B1

(12) United States Patent
Ramey

(10) Patent No.: US 8,539,307 B1
(45) Date of Patent: Sep. 17, 2013

(54) DEVICE FOR AND METHOD OF LINEAR INTERPOLATIVE CODING

(75) Inventor: Ray L. Ramey, Ellicott City, MD (US)

(73) Assignee: The United States of America as represented by the Director, National Security Agency, Washington, DC (US)

( * ) Notice: Subject to any disclaimer, the term of this patent is extended or adjusted under 35 U.S.C. 154(b) by 94 days.

(21) Appl. No.: 13/385,029

(22) Filed: Jan. 11, 2012

(51) Int. Cl.
*H03M 13/00* (2006.01)

(52) U.S. Cl.
USPC ............................ 714/758; 714/781; 714/799

(58) Field of Classification Search
USPC .......................................... 714/758, 781, 799
See application file for complete search history.

(56) References Cited

U.S. PATENT DOCUMENTS

| | | | | | |
|---|---|---|---|---|---|
| 3,668,631 | A | * | 6/1972 | Griffith et al. | 714/774 |
| 4,686,644 | A | | 8/1987 | Renner et al. | |
| 4,899,385 | A | | 2/1990 | Ketchum et al. | |
| 4,980,916 | A | | 12/1990 | Zinser | |
| 5,157,669 | A | * | 10/1992 | Yu et al. | 714/758 |
| 5,414,571 | A | * | 5/1995 | Matsushige et al. | 360/65 |
| 5,974,583 | A | * | 10/1999 | Joo | 714/784 |
| 7,391,827 | B2 | * | 6/2008 | Kusume | 375/340 |
| 7,467,346 | B2 | * | 12/2008 | Hassner et al. | 714/781 |
| 8,045,606 | B2 | * | 10/2011 | Oh et al. | 375/229 |
| 8,201,060 | B2 | * | 6/2012 | Lablans | 714/784 |

* cited by examiner

*Primary Examiner* — Esaw Abraham
(74) *Attorney, Agent, or Firm* — Robert D. Morelli

(57) ABSTRACT

A device and method of detecting and correcting errors in data having a control unit, a coefficient computation unit, an error computation unit, and an error detection and correction unit, where errors such as garbled data, missing data, and added data are either detected and corrected or just detected.

12 Claims, 2 Drawing Sheets

DEVICE FOR AND METHOD OF LINEAR INTERPOLATIVE CODING

FIELD OF INVENTION

The present invention relates, in general, to error detection/correction and fault detection/recovery and, in particular, to pulse or data error handling.

BACKGROUND OF THE INVENTION

Linear Predictive Coding attempts to predict a future data value. It would be useful to be able to have a device that detects and corrects errors in both a future and a past data value. The present invention is such a device.

U.S. Pat. No. 4,686,644, entitled "LINEAR PREDICTIVE CODING TECHNIQUE WITH SYMMETRICAL CALCULATION OF Y-AND B-VALUES," discloses a digital lattice filter that includes a Y-adder and a B-adder. U.S. Pat. No. 4,686,644 is hereby incorporated by reference into the specification of the present invention.

U.S. Pat. No. 4,899,385, entitled "CODE EXCITED LINEAR PREDICTIVE VOCODER," discloses a device for encoding speech using a code excited linear predictive encoder using a recursive computational unit. U.S. Pat. No. 4,899,385 is hereby incorporated by reference into the specification of the present invention.

U.S. Pat. No. 4,980,916, entitled "METHOD FOR IMPROVING SPEECH QUALITY IN CODE EXCITED LINEAR PREDICTIVE SPEECH CODING," discloses a method of achieving higher quality speech by reconciling differences between the estimator and the filter of a code excited linear predictive voice coder. U.S. Pat. No. 4,980,916 is hereby incorporated by reference into the specification of the present invention

SUMMARY OF THE INVENTION

It is an object of the present invention to improve the detection and correction of errors in data.

It is another object of the present invention to improve the detection and correction of errors in data by estimating both backward and forward coefficients.

The present invention is a device for and method of detecting and correcting errors in data by estimating backward and forward coefficients.

The device includes a control unit, having a first input, a second input, a first output, a second output, a third output, a fourth output, a fifth output, a sixth output, a seventh output, and an eighth output.

The device also includes a coefficient computation unit, having a first input connected to the first output of the control unit, having a second input connected to the second output of the control unit, having a third input connected to the third output of the control unit, having a fourth input, and having an output.

The device also includes an error computation unit, having a first input connected to the fourth input of the coefficient computation unit, having a second input connected to the output of the coefficient computation unit, and having an output connected to the first input of the control unit.

The device also includes an error detection and correction unit, having a first input connected to the fourth input of the coefficient computation unit, having a second input connected to the output of the error computation unit, having a third input connected to the fourth output of the control unit, having a fourth input connected to the fifth output of the control unit, having a fifth input connected to the sixth output of the control unit, having a sixth input connected to the seventh output of the control unit, having a seventh input connected to the eighth output of the control unit, having a first output connected to the second input of the control unit, and having a second output.

DETAILED DESCRIPTION

The present invention is a device for and method of detecting and correcting errors in data by computing both backward and forward coefficients. The types of errors detected and corrected include garbled data, missing data, and added data. A garbled datum is a datum that is present but its value is incorrect for some reason (e.g., transmission error due to noise in the transmission channel). A missing datum is a datum that is supposed to be present in the data but is not present for some reason (e.g., synchronization error between the transmitter and the receiver). An added datum is a datum that is not supposed to be present but is present for some reason (e.g., perceived synchronization error between the transmitter and the receiver that caused the transmitter to ensure the transmission of the datum by transmitting it more than once and the receiver receiving more than one of a particular datum).

Figure 1:
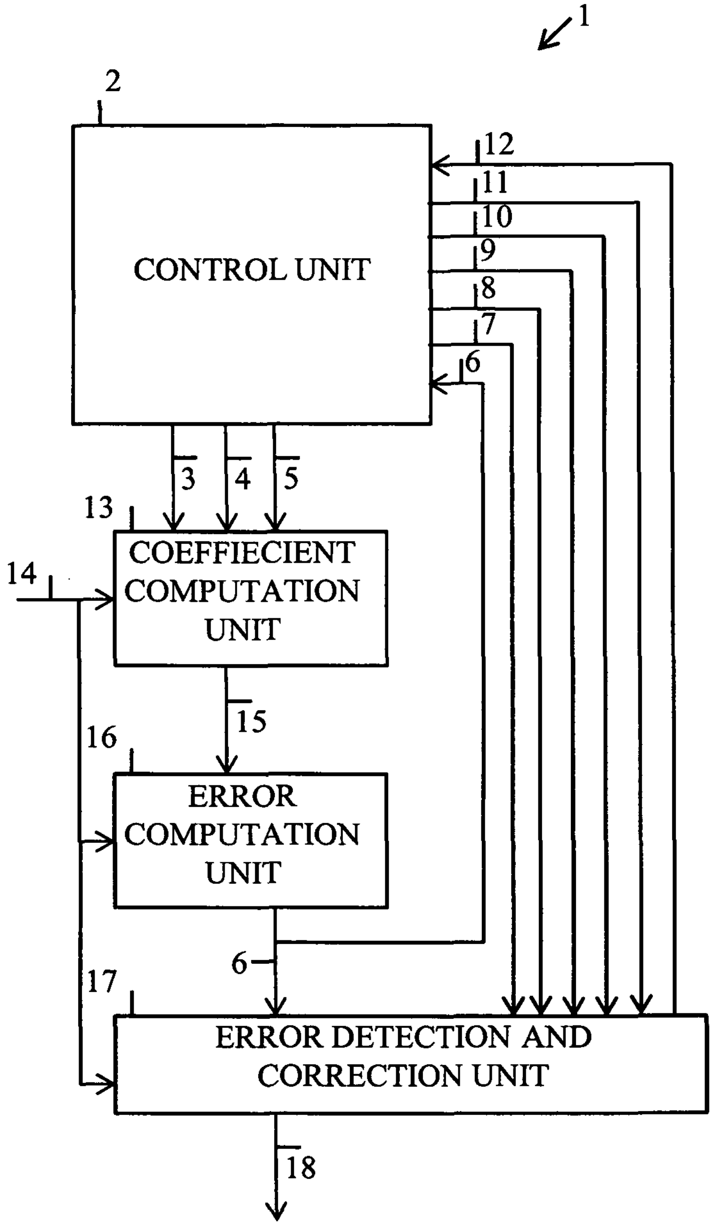
FIG. 1 is a schematic of the present invention.

FIG. 1 is a schematic of the device 1 of the present invention.

The device 1 includes a control unit 2, having a first input 6, a second input 12, a first output 3, a second output 4, a third output 5, a fourth output 7, a fifth output 8, a sixth output 9, a seventh output 10, and an eighth output 11. The first input 6 receives an error computation from an error computation unit 16 described below. The second input 12 receives a notice that an error was detected by an error detection and correction unit 17 described below. The first output 3 transmits a signal to a coefficient computation unit 13, described below, to compute coefficients. The second output 4 transmits necessary parameters (i.e., number of backward coefficients B to compute, number of forward coefficients F to compute, and a number of data samples N to use to compute the backward and forward coefficients, where B, F, and N are integers greater than or equal to 1). A backward coefficient is a coefficient that corresponds to a datum received before a user-definable datum was received. A forward coefficient is a coefficient that corresponds to a datum received after a user-definable datum was received. The third output 5 transmits a signal to the coefficient computation unit 13 instructing it to use a particular mode to compute backward and forward coefficients (i.e., adaptive mode or non-adaptive mode). The fourth output 7 transmits a signal to the error detection and correction unit 17 informing it of a threshold S to use to determine if an error has occurred in the data or not. The fifth output 8 transmits a signal to the error detection and correction unit 17 instructing it to detect errors in data but not correct any error detected. The sixth output 9 transmits a signal to the error detection and correction unit 17 instructing it to correct garbled data, if any (i.e., identify a garbled datum in the data and replace it with a possible correct datum). The seventh output 10 transmits a signal to the error detection and correction unit 17 instructing it to correct missing data, if any (i.e., insert a possible correct datum into the data). The eighth output 11 transmits a signal to the error detection and correction unit 17 instructing it to correct added data, if any (i.e., identify a duplicated datum in the data and delete one of the duplications). If the control unit 2 instructs the error detection and correction unit 17 to correct more than one type of error then each necessary correction will be determined and an error computation will be made for each proposed correction. The proposed correction that would result in the smallest error computation will be the only correction made to the data, and the other proposed corrections will not be made. The control unit 2 is preprogrammed (e.g., microcode, field programmable gate array, etc.) by a user with a user-definable set of possible values and instructions and may be reprogrammed by the user at anytime with a different set of possible values and instructions.

The control unit 2 monitors errors sent to it via its first input 6 from an error computation unit 16 described below and computes an average and standard deviation of the last user-definable T errors. Before T errors are accumulated by the present invention, T is set to a user-definable value for any equation in the present invention that includes T. The control unit 2 sets an error detection threshold to be a user-definable number S (e.g., 5) standard deviations away from the average it computed. Before the average can be computed, S is set to a user-definable value for any equation in the present invention that includes S. If a user-definable number of consecutive errors are sent to the control unit 2 (e.g., a user-definable fraction of 10×(B+F)) then the control unit 2, via its first output 3, instructs the coefficient computation unit 13 to compute new backward and forward coefficients for the next N data samples, when the mode indicated by the third output 5 of the control unit 2 is non-adaptive mode.

The device 1 includes a coefficient computation unit 13, having a first input connected to the first output 3 of the control unit 2, having a second input connected to the second output 4 of the control unit 2, having a third input connected to the third output 5 of the control unit 2, having a fourth input 14, and having an output 15. The first input of the coefficient computation unit 13 receives a signal to initiate a computation of backward and forward coefficients. The second input of the coefficient computation unit 13 receives necessary parameters (i.e., B, F, and N described above) for computing backward and forward coefficients. The third input of the coefficient computation unit 13 receives a signal to indicate which type of coefficient computation should be initiated (e.g., adaptive mode or non-adaptive mode). In non-adaptive mode, the backward and forward coefficients are computed using an initial set of data samples and remain fixed until a signal to initiate another computation of backward and forward coefficients is received. In adaptive mode, the backward and forward coefficients are computed using an initial set of data samples and are updated in accordance with each subsequent datum received. The fourth input 14 receives data on which error detection and correction is performed. The output 15 transmits the backward and forward coefficients computed by the coefficient computation unit 13.

The coefficient computation unit 13 computes coefficients by receiving at the fourth input 14 a data sequence (i.e., x(0), x(1), . . . ). The coefficient computation unit 13 receives an instruction at its first input 3 to compute backward coefficients (i.e., $b_i$) and forward coefficients (i.e., $f_i$). The coefficient computation unit 13 receives parameters B, F, and N at its second input 4 instructing it on how many (i.e., B) backward coefficients (i.e., $b_1, b_2, \ldots, b_B$) to compute, how many (i.e., F) forward coefficient (i.e., $f_1, f_2, \ldots, f_F$) to compute, and how much received data N (i.e., x(0), x(1), . . . , x(N−1)) on which to compute the backward and forward coefficients, respectively. The backward and forward coefficients are determined to be the backward and forward coefficients that minimize the following equation:

$$\sum_{n=B}^{T-F}\left(x(n)-\left(\sum_{k=1}^{B} b_k x(n-k)+\sum_{k=1}^{F} f_k x(n+k)\right)\right)^2.$$

The backward and forward coefficients are obtained by solving the following equation:

$$\vec{c}=R^{-1}\vec{s},$$

where R is a (B+F)×(B+F) matrix of the following form:

$$R=\begin{bmatrix} UL & UR \\ LL & LR \end{bmatrix},$$

where UL is a B×B matrix whose row j and column k entries are as follows:

$$\sum_{n=B}^{T-F} x(n-(B-k))x(n-(B-j)),$$

$$\text{for } j=0,1,\ldots,B-1, \text{ and } k=0,1,\ldots,B-1;$$

where UR is a B×F matrix whose row j and column k entries are as follows:

$$\sum_{n=B}^{T-F} x(n+k+1)x(n-(B-j)),$$

$$\text{for } j=0,1,\ldots,B-1, \text{ and } k=0,1,\ldots,F-1;$$

where LL is a F×B matrix whose row j and column k entries are as follows:

$$\sum_{n=B}^{T-F} x(n-(B-k))x(n+j+1),$$

$$\text{for } j=0,1,\ldots,F-1, \text{ and } k=0,1,\ldots,B-1; \text{ and}$$

where LR is a F×F matrix whose row j and column k entries are as follows:

$$\sum_{n=B}^{T-F} x(n+k+1)x(n+j+1)),$$

$$\text{for } j=0,1,\ldots,F-1, \text{ and } k=0,1,\ldots,F-1.$$

Note that $\vec{c}$ is a (B+F)-long column vector of the backward and forward coefficients as follows:

$$\vec{c} = \begin{pmatrix} b_B \\ \vdots \\ b_1 \\ f_1 \\ \vdots \\ f_F \end{pmatrix},$$

and $\bar{s}$ is a (B+F)-long column vector of the backward and forward correlations as follows:

$$\vec{s} = \begin{pmatrix} \sum_{n=B}^{T-F} x(n)x(n-B) \\ \vdots \\ \sum_{n=B}^{T-F} x(n)x(n-1) \\ \sum_{n=B}^{T-F} x(n)x(n+1) \\ \vdots \\ \sum_{n=B}^{T-F} x(n)x(n+F) \end{pmatrix}.$$

The device 1 includes an error computation unit 16, having a first input connected to the fourth input 14 of the coefficient computation unit 13, having a second input connected to the output 15 of the coefficient computation unit, and having an output connected to the first input 6 of the control unit 2. For each data sample x(n), the error computation unit 16 computes errors as follows:

$$e(n) = x(n) - \left(\sum_{k=1}^{B} b_k x(n-k) + \sum_{k=1}^{F} f_k x(n+k)\right).$$

The error computation unit 16 passes errors it computes via its output 6 to the control unit 2 and an error detection and correction unit 17 described below.

The device 1 includes an error detection and correction unit 17, having a first input connected to the fourth input 14 of the coefficient computation unit 13, having a second input connected to the output 6 of the error computation unit 16, having a third input connected to the fourth output 7 of the control unit 2, having a fourth input connected to the fifth output 8 of the control unit 2, having a fifth input connected to the sixth output 9 of the control unit 2, having a sixth input connected to the seventh output 10 of the control unit 2, having a seventh input connected to the eighth output 11 of the control unit 2, having a first output connected to the second input 12 of the control unit 2, and having a second output 18. The error detection and correction unit 17 receives the data on which the backward and forward coefficients were computed via its first input 14 and the error computed on the data via its second input 1. The error detection and correction unit 17 receives a threshold for determining when an error has occurred in received data and instructions (or not) on what errors to detect and whether or not to correct detected errors from the control unit as follows: receives an error threshold S described above for determining when an error has occurred in the N received data samples described above via the third input 7, receives instruction (or not) to detect errors but not correct them via its fourth input 8, receives instruction (or not) to correct detected garbled data via its fifth input 9, receives instruction (or not) to correct missing data via its sixth input 10, and receives instruction (or not) to correct added data via its seventh input 11. If the error detection and correction unit 17 detects an error it informs the control unit 2 of this via its first output 12. Corrected or uncorrected data appears at the second output 18 of the error detection and correction unit 17.

The error detection and correction unit 17 detects errors by comparing errors (i.e., e(n)) calculated by the error computation unit 16 on N data samples received against the error threshold S supplied by the control unit 2. If e(n) exceeds S then the error detection and correction unit 17 either degarbles a datum, inserts a datum into the received data, or deletes a datum from the received data depending on the instructions received from the control unit 2. If the error detection and correction unit 17 is not instructed by the control unit 2 to correct any type of error then the error detection and correction unit 17 detects errors and informs the control unit 2 of any error detected but does not correct the errors and outputs the data as received.

When the control unit 2, via the sixth output 9, instructs the error detection and correction unit 17 to correct a garbled datum in the received N data samples and an error at sample n exceeds the threshold S then the error detection and correction unit 17 calculates a possible correct datum that could replace the garbled datum. That is, for i=−B, −B+1, . . . , F, possible correct data are as follows:

$$x'(n+i) = \sum_{k=1}^{B} b_k x(n+i+k) + \sum_{k=1}^{F} f_k x(n+i+k)$$

and corresponding errors are computed as follows:

$$e'(i) = \sum_{j=-B}^{F}\left(x(n+i+j) - \sum_{k=1}^{B} b_k x(n+i+j-k) + \sum_{k=1}^{F} f_k x(n+i+j+k)\right)^2.$$

If j=k in the error computation then x(n+i+j−k) is replaced with a potentially correct x'(n+i). If j=−k then x(n+i+j+k) is replaced with potentially correct x'(n+i). The value for i for which e'(i) is minimal is assumed to be the best correction for the garbled datum. The value of the minimal e'(i) is recorded along with the position n+i. If e'(i) is less than a user-definable amount (e.g., half) of the following value:

$$e = \sum_{j=-B}^{F}\left(x(n+j) - \sum_{k=1}^{B} b_k x(n+j-k) + \sum_{k=1}^{F} f_k x(n+j+k)\right)^2$$

and if e'(i) is less than the errors associated with correcting missing data and correcting inserted data, if such corrections were instructed to be performed, then the value of the garbled data x(n+i) will be changed to x'(n+i) and the error detection and correction unit 17 will inform, via the first output 12, the control unit 2 of the detection and correction.

When the control unit 2, via the sixth output 9, instructs the error detection and correction unit 17 to correct missing data in the received N data samples and an error at sample n exceeds the threshold S then the error detection and correction unit 17 calculates a possible correct datum that could be inserted into the data. That is, for i=−B, −B+1, . . . , F, possible correct data are as follows:

$$x'(n+i)=\sum_{k=1}^{B} b_k x(n+i-k)+\sum_{k=1}^{F} f_k x(n+i+k-1).$$

A new sequence y(m) of data is formed, where y(m)=x(m) if m<(n+i), where y(m)=x'(n+i) if m=(n+i), and where y(m)=x(m−1), if m>(n+i). Note that x'(n+i) is inserted between data samples x(n+i−1) and x(n+i). Corresponding errors are computed as follows:

$$e'(i)=\sum_{j=-B}^{F}\left(y(n+i+j)-\sum_{k=1}^{B} b_k y(n+i+j-k)+\sum_{k=1}^{F} f_k y(n+i+j+k-1)\right)^2.$$

The value for i for which e'(i) is minimal is assumed to be the best correction for inserting a datum into the received data. The value of the minimal e'(i) is recorded along with the position n+i. If e'(i) is less than a user-definable amount (e.g., half) of the following value:

$$e=\sum_{j=-B}^{F}\left(x(n+j)-\sum_{k=1}^{B} b_k x(n+j-k)+\sum_{k=1}^{F} f_k x(n+j+k)\right)^2$$

and if e'(i) is less than the errors associated with correcting garbles and correcting added data, if such corrections were instructed to be performed, then the value of the corrected missing data x(n+i) will be inserted at the appropriate point in the data and the error detection and correction unit 17 will inform, via the first output 12, the control unit 2 of the detection and correction.

When the control unit 2, via the sixth output 9, instructs the error detection and correction unit 17 to correct added data in the received N data samples and an error at sample n exceeds the threshold S then the error detection and correction unit 17 calculates a possible added datum that should be removed from the data. That is, for i=−B, −B+1, . . . , F, errors are computed that correspond to deleting a datum at each of B+F+1 positions (i.e., deleting datum x(n+i+j+1)) as follows:

$$e'(i)=\sum_{j=-B}^{F}\left(x(n+i+j)-\sum_{k=1}^{B} b_k x(n+i+j-k)+\sum_{k=1}^{F} f_k x(n+i+j+k+1)\right)^2.$$

The value for i for which e'(i) is minimal is assumed to be the best correction for deleting a datum in the received data. The value of the minimal e'(i) is recorded along with the position n+i. If e'(i) is less than a user-definable amount (e.g., half) of the following value:

$$e=\sum_{j=-B}^{F}\left(x(n+j)-\sum_{k=1}^{B} b_k x(n+j-k)+\sum_{k=1}^{F} f_k x(n+j+k)\right)^2$$

and if e'(i) is less than the errors associated with correcting garbles and correcting missing data, if such corrections were instructed to be performed, then the value of the corrected inserted data x(n+i) will be deleted from the appropriate point in the data and the error detection and correction unit 17 will inform, via the first output 12, the control unit 2 of the detection and correction.

If none of the above-identified corrections results in a sufficiently small error then the error is noted, but no correction to the received data is made. For example, one of the above-identified error corrections must result in an error value that is less than a user-definable number (e.g., 0.50) times the following value:

$$e=\sum_{j=-B}^{F}\left(x(n+j)-\sum_{k=1}^{B} b_k x(n+j-k)+\sum_{k=1}^{F} f_k x(n+j+k)\right)^2.$$

In the preferred embodiment, only the error correction that results in the minimum error below the above-identified threshold will be performed, no matter how many of the error corrections were instructed to be performed.

If the adaptive coefficient mode is specified, the coefficients are first computed for a block of N data samples as described above. Then, the resulting coefficients are modified. The modification entails computing an error for each datum as follows:

$$e(n)=x(n)-\left(\sum_{k=1}^{B} b_k x(n-k)+\sum_{k=1}^{F} f_k x(n+k)\right).$$

Then, the coefficients are updated as follows:

$b_k=b_k+\mu e(n)\times(n-k), for\ k=1,2, \ldots, B$ and $f_k=f_k+\mu e(n)\times(n+k), for\ k=1,2, \ldots, F,$ where μ is a user-definable positive number between 0 and 1. The updated coefficients are sent to the error computation unit 16 for each new data sample. The error monitoring and reset conditions are conducted by the control unit 2 as described above. When performing error correction, the coefficients are held constant at the value that produced an error above the threshold S.

Figure 2:
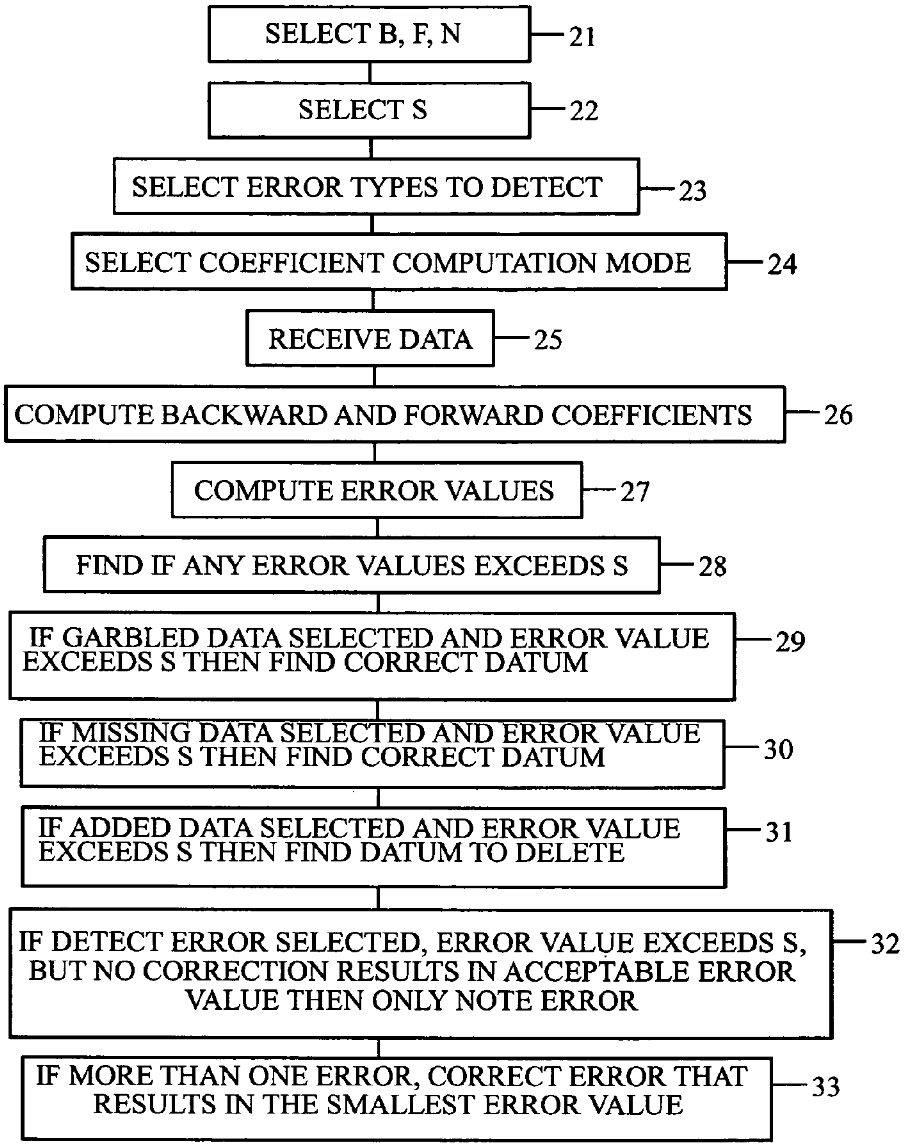
FIG. 2 is a flow-chart of the method of the present invention.

FIG. 2 is a flow-chart of the method of the present invention.

The first step 21 of the method is selecting on a computing device a user-definable number B of backward coefficients to be computed, a user-definable number F of forward coefficients to be computed, and a number of data samples N to use to compute the backward and forward coefficients, where B, F, and N are integers greater than or equal to 1.

The second step 22 of the method is selecting on the computing device an error threshold S to use to determine if an error has occurred in received data or not. Initially S is a user-definable number. After sufficient data is available, S is the average of the last user-definable T errors, where T is a user-definable number.

The third step 23 of the method is selecting on the computing device at least one type of error to detect from the group of errors consisting of garbled data, missing data, and added data.

The fourth step 24 of the method is selecting on the computing device the mode for computing backward and forward coefficients from the group of modes consisting of non-adaptive mode and adaptive mode. If non-adaptive mode is selected then coefficients are computed once unless new coefficients should be computed. For example, new coefficients should be computed for a next N data samples if a user-definable number of consecutive errors occur (e.g., a user-definable fraction of 10×(B+F)). If adaptive coefficient mode is selected then the coefficients are computed for N data samples and modified for each subsequent datum. In adaptive mode, an error value for each subsequent datum is computed as follows:

$$e(n) = x(n) - \left(\sum_{k=1}^{B} b_k x(n-k) + \sum_{k=1}^{F} f_k x(n+k)\right).$$

Then, the coefficients initially computed are updated as follows:

$$b_k = b_k + \mu e(n) \times (n-k), \text{ for } k = 1, 2, \ldots, B \text{ and}$$

$$f_k = f_k + \mu e(n) \times (n+k), \text{ for } k = 1, 2, \ldots, F,$$

where μ is a user-definable positive number between 0 and 1.

The fifth step 25 of the method is receiving on the computing device data (i.e., x(0), x(1), . . . ).

The sixth step 26 of the method is computing on the computing device backward coefficients (i.e., $b_1, b_2, \ldots, b_B$) and forward coefficients (i.e., $f_1, f_2, \ldots, f_F$) on N samples of the received data (i.e., x(0), x(1), . . . , x(N−1)). The backward and forward coefficients are determined to be the backward and forward coefficients that minimize the following equation:

$$\sum_{n=B}^{T-F} \left( x(n) - \left( \sum_{k=1}^{B} b_k x(n-k) + \sum_{k=1}^{F} f_k x(n+k) \right) \right)^2.$$

The backward and forward coefficients are obtained by solving the following equation:

$$\vec{c} = R^{-1} \vec{s},$$

where R is a (B+F)×(B+F) matrix of the following form:

$$R = \begin{bmatrix} UL & UR \\ LL & LR \end{bmatrix},$$

where UL is a B×B matrix whose row j and column k entries are as follows:

$$\sum_{n=B}^{T-F} x(n-(B-k))x(n-(B-j)),$$

$$\text{for } j = 0, 1, \ldots, B-1, \text{ and } k = 0, 1, \ldots, B-1;$$

where UR is a B×F matrix whose row j and column k entries are as follows:

$$\sum_{n=B}^{T-F} x(n+k+1)x(n-(B-j)),$$

$$\text{for } j = 0, 1, \ldots, B-1, \text{ and } k = 0, 1, \ldots, F-1;$$

where LL is a F×B matrix whose row j and column k entries are as follows:

$$\sum_{n=B}^{T-F} x(n-(B-k))x(n+j+1),$$

$$\text{for } j = 0, 1, \ldots, F-1, \text{ and } k = 0, 1, \ldots, B-1; \text{ and}$$

where LR is a F×F matrix whose row j and column k entries are as follows:

$$\sum_{n=B}^{T-F} x(n+k+1)x(n+j+1)),$$

$$\text{for } j = 0, \ldots, F-1, \text{ and } k = 0, 1, \ldots, F-1.$$

Note that $\vec{c}$ is a (B+F)-long column vector of the backward and forward coefficients as follows:

$$\vec{c} = \begin{pmatrix} b_B \\ \vdots \\ b_1 \\ f_1 \\ \vdots \\ f_F \end{pmatrix},$$

and $\bar{s}$ is a (B+F)-long column vector of the backward and forward correlations as follows:

$$\vec{s} = \begin{pmatrix} \sum_{n=B}^{T-F} x(n)x(n-B) \\ \vdots \\ \sum_{n=B}^{T-F} x(n)x(n-1) \\ \sum_{n=B}^{T-F} x(n)x(n+1) \\ \vdots \\ \sum_{n=B}^{T-F} x(n)x(n+F) \end{pmatrix}.$$

The seventh step 27 of the method is computing on the computing device an error value e(n) for each data sample x(n) as follows:

$$e(n) = x(n) - \left(\sum_{k=1}^{B} b_k x(n-k) + \sum_{k=1}^{F} f_k x(n+k)\right).$$

The eighth step 28 of the method is determining on the computing device if an error has occurred in the N data samples if an e(n) exceeds the error threshold S.

The ninth step 29 of the method is if correcting garbled data was selected and an error at sample n exceeded S then calculating on the computing device a possible correct datum that could replace the garbled datum. That is, for i=−B, −B+1, . . . , F, possible correct data are as follows:

$$x'(n+i)=\sum_{k=1}^{B}b_k x(n+i-k)+\sum_{k=1}^{F}f_k x(n+i+k)$$

and corresponding errors are computed as follows:

$$e'(i)=\sum_{j=-B}^{F}\left(x(n+i+j)-\sum_{k=1}^{B}b_k x(n+i+j-k)+\sum_{k=1}^{F}f_k x(n+i+j+k)\right)^2.$$

If j=k in the error computation then x(n+i+j−k) is replaced with a potentially correct x'(n+i). If j=−k then x(n+i+j+k) is replaced with potentially correct x'(n+i). The value for i for which e'(i) is minimal is assumed to be the best correction for the garbled datum. The value of the minimal e'(i) is recorded along with the position n+i. If e'(i) is less than a user-definable amount (e.g., half) of the following value:

$$e=\sum_{j=-B}^{F}\left(x(n+j)-\sum_{k=1}^{B}b_k x(n+j-k)+\sum_{k=1}^{F}f_k x(n+j+k)\right)^2$$

and if e'(i) is less than the errors associated with correcting missing data and correcting inserted data, if such corrections were instructed to be performed, then the value of the garbled data x(n+i) will be changed to x'(n+i).

The tenth step 30 of the method is if correcting on the computing device missing data was selected and if an error at sample n in the received N data samples exceeds S then calculating a possible correct datum that could be inserted into the data. That is, for i=−B, −B+1, . . . , F, possible correct datum is as follows:

$$x'(n+i)=\sum_{k=1}^{B}b_k x(n+i-k)+\sum_{k=1}^{F}f_k x(n+i+k-1).$$

A new sequence y(m) of data is formed, where y(m)=x(m) if m<(n+i), where y(m)=x'(n+i) if m=(n+i), and where y(m)=x(m−1), if m>(n+i). Note that x'(n+i) is inserted between data samples x(n+i−1) and x(n+i). Corresponding errors are computed as follows:

$$e'(i)=\sum_{j=-B}^{F}\left(y(n+i+j)-\sum_{k=1}^{B}b_k y(n+i+j-k)+\sum_{k=1}^{F}f_k y(n+i+j+k-1)\right)^2.$$

The value for i for which e'(i) is minimal is assumed to be the best correction for inserting a datum into the received data. The value of the minimal e'(i) is recorded along with the position n+i. If e'(i) is less than a user-definable amount (e.g., half) of the following value:

$$e=\sum_{j=-B}^{F}\left(x(n+j)-\sum_{k=1}^{B}b_k x(n+j-k)+\sum_{k=1}^{F}f_k x(n+j+k)\right)^2$$

and if e'(i) is less than the errors associated with correcting garbles and correcting added data, if such corrections were instructed to be performed, then the value of the corrected missing data x(n+i) will be inserted at the appropriate point in the data.

The eleventh step 31 of the method is if correcting on the computing device added data was selected and if an error at sample n in the received N data samples exceeds S then identifying a possible datum that should be removed from the data. That is, for i=−B, −B+1, . . . , F, errors are computed that correspond to deleting a datum at each of B+F+1 positions (i.e., deleting datum x(n+i+j+1)) as follows:

$$e'(i)=\sum_{j=-B}^{F}\left(x(n+i+j)-\sum_{k=1}^{B}b_k x(n+i+j-k)+\sum_{k=1}^{F}f_k x(n+i+j+k+1)\right)^2.$$

The value for i for which e'(i) is minimal is assumed to be the best correction for deleting a datum in the received data. The value of the minimal e'(i) is recorded along with the position n+i. If e'(i) is less than a user-definable amount (e.g., half) of the following value:

$$e=\sum_{j=-B}^{F}\left(x(n+j)-\sum_{k=1}^{B}b_k x(n+j-k)+\sum_{k=1}^{F}f_k x(n+j+k)\right)^2$$

and if e'(i) is less than the errors associated with correcting garbles and correcting missing data, if such corrections were instructed to be performed, then the value of the inserted data x(n+i) will be deleted from the appropriate point in the data.

The twelfth step 32 of the method is if detect errors but do not make any changes was selected, an error at sample n in the received N data samples exceeds S, and if none of the above-identified corrections results in a user-definable sufficiently small error then the error is noted on the computing device but no correction to the received data is made. For example, one of the above-identified error corrections must result in an error value that is less than a user-definable number (e.g., 0.50) times the following value:

$$e=\sum_{j=-B}^{F}\left(x(n+j)-\sum_{k=1}^{B}b_k x(n+j-k)+\sum_{k=1}^{F}f_k x(n+j+k)\right)^2.$$

In the preferred embodiment, only the error correction that results in the minimum error below the above-identified threshold will be performed, no matter how many of the error corrections were instructed to be performed.

The thirteenth step 33 of the method is if more than one type of error detection was selected then determining on the computing device each necessary correction and computing an error for each proposed correction, where the proposed correction that results in a smallest error computation will be the only correction made to the data. When performing error correction, the coefficients are held constant at their values that produced an error above the threshold S.

What is claimed is:

1. A device for detecting and correcting errors in data, comprising:

a. a control unit, having a first input that receives an error computation, having a second input that receives a notice that an error was detected, having a first output for transmitting a signal to compute coefficients, having a second output for transmitting user-definable positive integers B, F, and N, having a third output for transmitting a signal to indicate a user-definable coefficient computation mode, having a fourth output for transmitting a user-definable error threshold S, having a fifth output for transmitting a signal to detect errors but not make changes if error values are below a user-definable threshold, having a sixth output for transmitting a signal to detect garbled data, having a seventh output to transmit a signal to detect missing data, and having an eighth output for transmitting a signal to detect added data, where the control unit computes an average and standard deviation of the a user-definable T errors, where T is initially set to a user-definable number;

b. a coefficient computation unit, having a first input connected to the first output of the control unit, having a second input connected to the second output of the control unit, having a third input connected to the third output of the control unit, having a fourth input, and having an output;

c. an error computation unit, having a first input connected to the fourth input of the coefficient computation unit, having a second input connected to the output of the coefficient computation unit, and having an output connected to the first input of the control unit; and d. an error detection and correction unit, having a first input connected to the fourth input of the coefficient computation unit, having a second input connected to the output of the error computation unit, having a third input connected to the fourth output of the control unit, having a fourth input connected to the fifth output of the control unit, having a fifth input connected to the sixth output of the control unit, having a sixth input connected to the seventh output of the control unit, having a seventh input connected to the eighth output of the control unit, having a first output connected to the second input of the control unit, and having a second output.

2. The device of claim 1, wherein the coefficient computation unit includes a first function block for computing $$\sum_{n=B}^{T-F}\left(x(n)-\left(\sum_{k=1}^{B} b_k x(n-k)+\sum_{k=1}^{F} f_k x(n+k)\right)\right)^2,$$

where x(n) is a datum in received data, where $b_i$ are backward coefficients, where $f_i$ are forward coefficients.

3. The device of claim 1, wherein the first block function includes a second block function for computing backward and forward coefficients by solving the following equation:

$$\vec{c}=R^{-1}\vec{s},$$

where R is a (B+F)×(B+F) matrix of the following form:

$$R=\begin{bmatrix} UL & UR \\ LL & LR \end{bmatrix},$$

where UL is a B×B matrix whose row j and column k entries are as follows:

$$\sum_{n=B}^{T-F} x(n-(B-k))x(n-(B-j)),\quad \text{for } j=0,\ 1,\ \ldots,\ B-1,\quad \text{and } k=0,\ 1,\ \ldots,\ B-1,$$

where UR is a B×F matrix whose row j and column k entries are as follows:

$$\sum_{n=B}^{T-F} x(n+k+1)x(n-(B-j)),\quad \text{for } j=0,\ 1,\ \ldots,\ B-1,\quad \text{and } k=0,\ 1,\ \ldots,\ F-1,$$

where LL is a F×B matrix whose row j and column k entries are as follows:

$$\sum_{n=B}^{T-F} x(n-(B-k))x(n+j+1),\quad \text{for } j=0,\ 1,\ \ldots,\ F-1,\quad \text{and } k=0,\ 1,\ \ldots,\ B-1,\quad \text{and}$$

where LR is a F×F matrix whose row j and column k entries are as follows:

$$\sum_{n=B}^{T-F} x(n+k+1)x(n+j+1)),\quad \text{for } j=0,\ 1,\ \ldots,\ F-1,\quad \text{and } k=0,\ 1,\ \ldots,\ F-1,$$

and where $\vec{c}$ is a (B+F)-long column vector of the backward and forward coefficients as follows:

$$\vec{c}=\begin{pmatrix} b_B \\ \vdots \\ b_1 \\ f_1 \\ \vdots \\ f_F \end{pmatrix},$$

and $\bar{s}$ is a (B+F)-long column vector of the backward and forward correlations as follows:

$$\vec{s} = \begin{pmatrix} \sum_{n=B}^{T-F} x(n)x(n-B) \\ \vdots \\ \sum_{n=B}^{T-F} x(n)x(n-1) \\ \sum_{n=B}^{T-F} x(n)x(n+1) \\ \vdots \\ \sum_{n=B}^{T-F} x(n)x(n+F) \end{pmatrix}.$$

4. The device of claim 1, wherein the error computation unit includes a third function block for computing errors as follows:

$$e(n) = x(n) - \left(\sum_{k=1}^{B} b_k x(n-k) + \sum_{k=1}^{F} f_k x(n+k)\right).$$

5. The device of claim 1, wherein the error detection and correction unit includes a fourth function block for detecting errors by comparing errors e(n) to S, where if e(n) exceeds S then an error is detected.

6. The device of claim 1, wherein the error detection and correction unit includes a fifth function block for correcting a garbled datum by calculating correct datum that replace the garbled datum for i=−B, −B+1, . . . , F, as follows:

$$x'(n+i) = \sum_{k=1}^{B} b_k x(n+i-k) + \sum_{k=1}^{F} f_k x(n+i+k),$$

where corresponding errors are computed as follows:

$$e'(i) = \sum_{j=-B}^{F} \left(x(n+i+j) - \sum_{k=1}^{B} b_k x(n+i+j-k) + \sum_{k=1}^{F} f_k x(n+i+j+k)\right)^2,$$

where if j=k in the error computation then x(n+i+j−k) is replaced with a potentially correct x'(n+i), If j=−k then x(n+i+j+k) is replaced with potentially correct x'(n+i), where i for which e'(i) is minimal is assumed to be the best correction for the garbled datum, where a value of the minimal e'(i) is recorded along with position n+i, where if e'(i) is less than a user-definable amount of the following value:

$$e = \sum_{j=-B}^{F} \left(x(n+j) - \sum_{k=1}^{B} b_k x(n+j-k) + \sum_{k=1}^{F} f_k x(n+j+k)\right)^2,$$

and where if e'(i) is less than the errors associated with correcting added data and correcting missing data, if such corrections were instructed to be performed, then the value of the garbled data x(n+i) will be changed to x'(n+i).

7. The device of claim 1, wherein the error detection and correction unit includes a sixth function block for correcting a missing datum by calculating correct datum to insert for i=−B, −B+1, . . . , F, as follows:

$$x'(n+i) = \sum_{k=1}^{B} b_k x(n+i-k) + \sum_{k=1}^{F} f_k x(n+i+k-1),$$

where a sequence y(m) of data is formed, where y(m)=x(m) if m<(n+i), where y(m)=x'(n+i) if m=(n+i), and where y(m)=x(m−1), if m>(n+i), where x'(n+i) is inserted between data samples x(n+i−1) and x(n+i), where corresponding errors are computed as follows:

$$e'(i) = \sum_{j=-B}^{F} \left(y(n+i+j) - \sum_{k=1}^{B} b_k y(n+i+j-k) + \sum_{k=1}^{F} f_k y(n+i+j+k-1)\right)^2,$$

where i for which e'(i) is minimal is assumed to be the best correction for inserting a datum into the received data, where the value of the minimal e'(i) is recorded along with position n+i, where if e'(i) is less than a user-definable amount of the following value:

$$e = \sum_{j=-B}^{F} \left(x(n+j) - \sum_{k=1}^{B} b_k x(n+j-k) + \sum_{k=1}^{F} f_k x(n+j+k)\right)^2,$$

where if e'(i) is less than the errors associated with correcting garbles and correcting added data, if such corrections were instructed to be performed, then the value of the corrected missing data x'(n+i) will be inserted at the appropriate point in the data.

8. The device of claim 1, wherein the error detection and correction unit includes a fifth function block for correcting an added datum by calculating added datum that is deleted for i=−B, −B+1, . . . , F, where errors are computed that correspond to deleting a datum at each of B+F+1 positions as follows:

$$e'(i) = \sum_{j=-B}^{F} \left(x(n+i+j) - \sum_{k=1}^{B} b_k x(n+i+j-k) + \sum_{k=1}^{F} f_k x(n+i+j+k+1)\right)^2,$$

where i for which e'(i) is minimal is assumed to be the best correction for deleting a datum in the received data, where the value of the minimal e'(i) is recorded along with position n+i, where if e'(i) is less than a user-definable amount of the following value:

$$e = \sum_{j=-B}^{F} \left(x(n+j) - \sum_{k=1}^{B} b_k x(n+j-k) + \sum_{k=1}^{F} f_k x(n+j+k)\right)^2,$$

where if e'(i) is less than the errors associated with correcting garbles and correcting missing data, if such corrections were instructed to be performed, then the value of the inserted data x(n+i) will be deleted from the appropriate point in the data and the error, and where if none of the above-identified corrections results in a sufficiently small error then the error is noted, but no correction to the received data is made, where error corrections must result in an error value that is less than a user-definable number times the following value:

$$e=\sum_{j=-B}^{F}\left(x(n+j)-\sum_{k=1}^{B}b_k x(n+j-k)+\sum_{k=1}^{F}f_k x(n+j+k)\right)^2.$$

9. The device of claim 1, wherein control unit transmits a coefficient computation mode that is selected from the group of modes consisting of non-adaptive mode and adaptive mode, where coefficients are computed once in non-adaptive mode and are computed initially and modified for each subsequent datum as follows:

$$e(n)=x(n)-\left(\sum_{k=1}^{B}b_k x(n-k)+\sum_{k=1}^{F}f_k x(n+k)\right),$$

where the coefficients are updated as follows:

$b_k=b_k+\mu e(n)\times(n-k), for\ k=1,2,\ldots,B$ and $f_k=f_k\mu e(n)\times(n+k), for\ k=1,2,\ldots,F,$ where μ is a user-definable positive number between 0 and 1.

10. A method of detecting and correcting errors in data, comprising the steps of:

a. selecting on a computing device a user-definable number B of backward coefficients to be computed, a user-definable number F of forward coefficients to be computed, and a number of data samples N to use to compute the backward and forward coefficients, where B, F, and N are integers greater than or equal to 1;

b. selecting on the computing device an error threshold S to use to determine if an error has occurred in received data or not, where S is a user-definable number, and where T is a user-definable number;

c. selecting on the computing device at least one type of error to detect from the group of errors consisting of garbled data, missing data, and added data;

d. selecting on the computing device a mode for computing backward and forward coefficients from the group of modes consisting of non-adaptive mode and adaptive mode;

e. receiving on the computing device data;

f. computing on the computing device backward coefficients $b_1$, $b_2$, . . . , $b_B$ and forward coefficients $f_1$, $f_2$, . . . , $f_F$ on N samples of the received data x(0), x(1), . . . , x(N−1);

g. computing on the computing device an error value e(n) for each data sample x(n) as follows:

$$e(n)=x(n)-\left(\sum_{k=1}^{B}b_k x(n-k)+\sum_{k=1}^{F}f_k x(n+k)\right);$$

h. determining on the computing device if an error has occurred in the N data samples if an e(n) exceeds the error threshold S;

i. if correcting garbled data was selected and an e(n) exceeded S then calculating on the computing device correct datum that replaces the garbled datum for i=−B, −B+1, . . . , F, where correct data are as follows:

$$x'(n+i)=\sum_{k=1}^{B}b_k x(n+i-k)+\sum_{k=1}^{F}f_k x(n+i+k)$$

and corresponding errors are computed as follows:

$$e'(i)=\sum_{j=-B}^{F}\left(x(n+i+j)-\sum_{k=1}^{B}b_k x(n+i+j-k)+\sum_{k=1}^{F}f_k x(n+i+j+k)\right)^2,$$

where if j=k in the error computation then x(n+i+j−k) is replaced with a potentially correct x'(n+i), where if j=−k then x(n+i+j+k) is replaced with potentially correct x'(n+i), where i for which e'(i) is minimal is assumed to be the best correction for the garbled datum, where the value of the minimal e'(i) is recorded along with the position n+i, where if e'(i) is less than a user-definable amount of the following value:

$$e=\sum_{j=-B}^{F}\left(x(n+j)-\sum_{k=1}^{B}b_k x(n+j-k)+\sum_{k=1}^{F}f_k x(n+j+k)\right)^2,$$

where if e'(i) is less than the errors associated with correcting added data and correcting missing data, where if such corrections were instructed to be performed, then the value of the garbled data x(n+i) will be changed to x'(n+i);

j. if correcting missing data was selected and if an e(n) exceeds S then calculating on the computing device correct datum that is inserted into the data for i=−B, −B+1, . . . , F, where correct data is as follows:

$$x'(n+i)=\sum_{k=1}^{B}b_k x(n+i-k)+\sum_{k=1}^{F}f_k x(n+i+k-1),$$

where sequence y(m) of data is formed, where y(m)=x(m) if m<(n+i), where y(m)=x'(n+i) if m=(n+i), and where y(m)=x(m−1), if m>(n+i), where x'(n+i) is inserted between data samples x(n+i−1) and x(n+i), where corresponding errors are computed as follows:

$$e'(i)=\sum_{j=-B}^{F}\left(y(n+i+j)-\sum_{k=1}^{B}b_k y(n+i+j-k)+\sum_{k=1}^{F}f_k y(n+i+j+k-1)\right)^2,$$

where the value for i for which e'(i) is minimal is assumed to be the best correction for inserting a datum into the received data, where the value of the minimal e'(i) is recorded along with the position n+i, where if e'(i) is less than a user-definable amount of the following value:

$$e=\sum_{j=-B}^{F}\left(x(n+j)-\sum_{k=1}^{B}b_k x(n+j-k)+\sum_{k=1}^{F}f_k x(n+j+k)\right)^2$$

and if e'(i) is less than the errors associated with correcting garbles and correcting added data, if such corrections were instructed to be performed, then the value of the corrected missing data x(n+i) will be inserted at the appropriate point in the data;

k. if correcting added data was selected and if an e(n) exceeds S then identifying on the computing device datum that is removed from the data for i=−B, −B+1, . . . , F, where errors are computed that correspond to deleting a datum at each B+F+1 position as follows:

$$e'(i)=\sum_{j=-B}^{F}\left(x(n+i+j)-\sum_{k=1}^{B}b_k x(n+i+j-k)+\sum_{k=1}^{F}f_k x(n+i+j+k+1)\right)^2,$$

where the value for i for which e'(i) is minimal is assumed to be the best correction for deleting a datum in the received data, where the value of the minimal e'(i) is recorded along with the position n+i, where if e'(i) is less than a user-definable amount of the following value:

$$e=\sum_{j=-B}^{F}\left(x(n+j)-\sum_{k=1}^{B}b_k x(n+j-k)+\sum_{k=1}^{F}f_k x(n+j+k)\right)^2$$

and if e'(i) is less than the errors associated with correcting garbles and correcting missing data, where if such corrections were instructed to be performed, then the value of the added data x(n+i) will be deleted from the appropriate point in the data;

l. if detect errors but do not make any changes was selected, an e(n) exceeds S, and if none of the above-identified corrections results in a user-definable sufficiently small error then recording on the computing device the error without correcting it, where to make a correction, one of the above-identified error corrections must result in an error value that is less than a user-definable number times the following value:

$$e=\sum_{j=-B}^{F}\left(x(n+j)-\sum_{k=1}^{B}b_k x(n+j-k)+\sum_{k=1}^{F}f_k x(n+j+k)\right)^2;\ \text{and}$$

m. if more than one type of error detection was selected then correcting on the computing device each necessary correction and computing an error value for each proposed correction, where the proposed correction that results in a smallest error computation will be the only correction made to the data, where when performing error correction, the coefficients are held constant at their values that produced an error above S.

11. The method of claim 10, wherein the step of selecting on the computing device a mode is comprised of selecting mode where if non-adaptive mode is selected then coefficients are computed once unless new coefficients should be computed, and where if adaptive coefficient mode is selected then the coefficients are computed for N data samples and modified for each subsequent datum, where an error value for each subsequent datum is computed as follows:

$$e(n)=x(n)-\left(\sum_{k=1}^{B}b_k x(n-k)+\sum_{k=1}^{F}f_k x(n+k)\right),$$

where the coefficients initially computed are updated as follows:

$$b_k=b_k+\mu e(n)\times(n-k), \text{for } k=1,2,\ldots,B \text{ and}$$

$$f_k=f_k+\mu e(n)\times(n+k), \text{for } k=1,2,\ldots,F,$$

where μ is a user-definable positive number between 0 and 1.

12. The method of claim 10, wherein the step of computing on the computing device backward coefficients $b_1, b_2, \ldots, b_B$ and forward coefficients $f_1, f_2, \ldots, f_F$ on N samples of the received data x(0), x(1), . . . , x(N−1) is comprised of determining the backward and forward coefficients that minimize the following equation:

$$\sum_{n=B}^{T-F}\left(x(n)-\left(\sum_{k=1}^{B}b_k x(n-k)+\sum_{k=1}^{F}f_k x(n+k)\right)\right)^2,$$

where the backward and forward coefficients are obtained by solving the following equation:

$$\vec{c}=R^{-1}\vec{s},$$

where R is a (B+F)×(B+F) matrix of the following form:

$$R=\begin{bmatrix} UL & UR \\ LL & LR \end{bmatrix},$$

where UL is a B×B matrix whose row j and column k entries are as follows:

$$\sum_{n=B}^{T-F}x(n-(B-k))x(n-(B-j)),$$

$$\text{for } j=0,1,\ldots,B-1, \text{ and } k=0,1,\ldots,B-1;$$

where UR is a B×F matrix whose row j and column k entries are as follows:

$$\sum_{n=B}^{T-F}x(n+k+1)x(n-(B-j)),$$

$$\text{for } j=0,1,\ldots,B-1, \text{ and } k=0,1,\ldots,F-1;$$

where LL is a F×B matrix whose row j and column k entries are as follows:

$$\sum_{n=B}^{T-F} x(n-(B-k))x(n+j+1),$$

$$\text{for } j=0, 1, \ldots, F-1, \quad \text{and } k=0, 1, \ldots, B-1; \quad \text{and}$$

where LR is a F×F matrix whose row j and column k entries are as follows:

$$\sum_{n=B}^{T-F} x(n+k+1)x(n+j+1)),$$

$$\text{for } j=0, 1, \ldots, F-1, \quad \text{and } k=0, 1, \ldots, F-1,$$

where $\vec{c}$ is a (B+F)-long column vector of the backward and forward coefficients as follows:

$$\vec{c} = \begin{pmatrix} b_B \\ \vdots \\ b_1 \\ f_1 \\ \vdots \\ f_F \end{pmatrix},$$

and $\bar{s}$ is a (B+F)-long column vector of the backward and forward correlations as follows:

$$\vec{s} = \begin{pmatrix} \sum_{n=B}^{T-F} x(n)x(n-B) \\ \vdots \\ \sum_{n=B}^{T-F} x(n)x(n-1) \\ \sum_{n=B}^{T-F} x(n)x(n+1) \\ \vdots \\ \sum_{n=B}^{T-F} x(n)x(n+F) \end{pmatrix}.$$

* * * * *